(12) United States Patent
Alexandersson

(10) Patent No.: US 6,606,006 B1
(45) Date of Patent: Aug. 12, 2003

(54) OSCILLATOR ON OPTIMIZED SEMICONDUCTING SUBSTRATE

(75) Inventor: Mats Alexandersson, Linnégatan (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/658,103

(22) Filed: Sep. 8, 2000

(30) Foreign Application Priority Data

Sep. 8, 1999 (SE) ............................................... 9903219

(51) Int. Cl.[7] .............................. H03B 5/36; H03B 1/04; H03B 5/00
(52) U.S. Cl. .............................. 331/108 C; 331/108 D; 331/177 V; 331/117 R; 331/117 FE
(58) Field of Search ........................ 331/108 C, 108 D, 331/167, 177 V, 117 FE, 117 R; 257/499; 455/333

(56) References Cited

U.S. PATENT DOCUMENTS

| | | | |
|---|---|---|---|
| 3,778,717 A | 12/1973 | Okoshi et al. | ............... 455/129 |
| 4,749,963 A | 6/1988 | Makimoto et al. | ............ 331/99 |
| 5,057,803 A | 10/1991 | Ooi et al. | .................... 333/204 |
| 5,075,641 A | 12/1991 | Weber et al. | ........... 331/108 C |
| 5,309,119 A * | 5/1994 | Shiga | ........................... 331/99 |
| 5,617,104 A | 4/1997 | Das | ..................... 343/700 MS |
| 6,169,461 B1 | 1/2001 | Andoh et al. | ........... 331/117 D |
| 6,249,191 B1 * | 6/2001 | Forbes | ................. 331/117 FE |
| 6,285,866 B1 * | 9/2001 | Lee et al. | .................... 455/318 |

FOREIGN PATENT DOCUMENTS

| | | |
|---|---|---|
| DE | 3038263 | 10/1980 |
| DE | 195 07 786 | 12/1996 |
| EP | 0 627 812 | 2/1999 |
| JP | 8-293728 | 11/1996 |
| WO | 00/54405 | 9/2000 |

* cited by examiner

*Primary Examiner*—Arnold Kinkead

(57) ABSTRACT

The present invention relates to an oscillator having a first substrate on which a resonator circuit and an amplifier circuit are arranged. The resonator circuit has a first set of components and the amplifier circuit has an amplifier transistor and a second set of components. The first substrate includes at least two additional substrates: a second substantially insulating substrate and a third substantially semiconducting substrate. At least the amplifier transistor is arranged on the third substrate and the first and second sets of components are arranged on the second substantially insulating substrate.

3 Claims, 3 Drawing Sheets

OSCILLATOR ON OPTIMIZED SEMICONDUCTING SUBSTRATE

This application claims priority under 35 U.S.C. §§119 and/or 365 to 9903219-5 filed in Sweden on Sep. 8, 1999; the entire content of which is hereby incorporated by reference.

TECHNICAL FIELD

The present invention relates to oscillators, specially a voltage-controlled oscillator, preferably an oscillator realized in MMIC (Monolithic Microwave Integrated Circuit) technique. The oscillator comprises a first substrate, on which a resonator circuit and an amplifier circuit are arranged. The resonator circuit comprises first set of components and said amplifier circuit comprising a second set of components and an amplifier transistor.

BACKGROUND

Some contradictory compromises must be made when designing broadband oscillators with low phase noise. Also, the limiting characteristics of the components constituting the oscillator must be taken into consideration.

The phase noise of an oscillator is given by the so-called Leeson's equation (1):

$$L(f_m) = \frac{1}{2}\left[1 + \frac{1}{f_m^2}\left(\frac{f_0}{2Q}\right)^2\right]\frac{FkT}{P}\left(1 + \frac{f_c}{f_m}\right)[dBc/Hz] \quad (1)$$

Where $f_m$ = offset frequency from the oscillation frequency, $f_0$ = oscillation frequency, $F$ = phase noise of the reflection amplifier, $k$ = Boltzmann constant, $T$ = temperature, $f_c$ = switching frequency for $1/f$ noise, $Q$ = Q-factor for resonator circuit, and $P$ = input power of the reflection amplifier.

Every oscillator is a periodically time-varying system, and the time varying nature of it must be considered when modelling phase noise. The noise source in the circuit can be divided into two groups: device noise such as thermal, shot and flicker noise and interface such as substrate and supply noise.

When designing a resonator circuit for a voltage-controlled oscillator (VCO), usually varactor diodes are used as voltage controlled capacitors. Advantageously, these are realised on GaAs (Gallium Arsenide) or Si (Silicon) substrates. However, GaAs is preferred as a considerably better Q-value is obtained for the resonator circuit as a whole. This is due to the fact that both varactor diodes and planar inductor coils have superior performance on GaAs relative to Si. Especially the resonator circuit usually comprises an inductor, which is a metallic coil directly arranged on the semiconductor surface. Since it is advantageous to arrange the inductor coil on an insulating substrate, a GaAs substrate which is substantially insulating is more suitable than a Si substrate which is semi-insulating. The same applies to the case of a microstrip transmission line resonator. A resonator with variable resonance is described in the Swedish patent application No. 9900850-0, "Varactor Coupled High-Q Monolithic Resonator" (Resonator Application).

The differences between GaAs and Si are specially outstanding for frequencies above some GHz, which in fact prevents employment of Si for producing resonant LC structures thereon.

As mentioned above, the oscillator comprises a second amplifier part which preferably is a reflection amplifier. In a preferred embodiment which is based on a transistor, the reflection amplifier has an amount of amplification that is needed to overcome the losses of the resonator and thus obtain a self oscillation. An output is arranged on an appropriate point of the amplifier and connected to the signal chain.

Known transistor techniques on GaAs are, e.g. MESFET (Metal-Schottky Field Effect Transistor), PHEMT (Pseudomorphic High Electron Mobility Transistor) and HBT (Heterojunction Bipolar Transistor). Generally, PHEMT offers good amplification at high frequencies, MESFET has low cost of production and HBT has high efficiency, positive voltage supply and good linearity.

Generally, on Si CMOS and bipolar processes are used. The development of the Si transistors has resulted in applicable transistors for frequencies up to 10 GHz. The SiGe technique provides much higher cut off frequencies and it performance can seriously be compared to[]the GaAs processes. Also, with regard to the price, the Si-based processes have considerable advantages.

A demand for a transistor to be used in an oscillator is that the transistor has a low I/f-noise. Consequently, this low frequency noise is converted through the non-linearity of the circuit to phase noise. Consequently, also the non-linear characteristics of the transistor which are of interest are effected. Mainly, the I/f noise is a surface phenomenon meaning that transistors having vertical structure, such as bipolar transistors, have a lower I/f noise than surface oriented transistors, such as MESFET and PHEMT. Typically, the switch frequency for I/f noise for the different transistor techniques range from >1 MHZ for GaAs PHEMT and MESFET, >100 kHz for GaAs HBT and <10 kHz for Si BJT. The result is that on GaAs usually HBT technique is preferred when producing oscillators. However, the yet lower switching frequency of the bipolar Si transistors could additionally reduce the phase noise if it was possible to use these types of transistors.

Among the GaAs HBTs, there are two main groups with different material in the emitter layer: AlGaAs/GaAs-HBT and InGaP/GaAs-HBT. Different manufacturers use different material. In HBTs with AlGaAs appear so-called deep electron traps, due to the aluminum content. The traps are actuated by heat and trap and release electrons with some certain time constants, which results in a disturbance in the uniform flow of the electrons. The disturbance appears as noise, which assumes Lorentz formed spectra in the frequency range of 10 kHz to 1 MHZ. This is an additional low frequency noise contribution which can be converted to the phase noise in an oscillator and it is normally called generation-recombination-noise (g-r-noise) or "burst noise". The temperature dependency of the nose results in temperature variations in the phase burst in an oscillator made of said type of transistors. HBTs with InGaP in the emitter layer are normally free from mentioned type of electron traps. However, a manufacturer uses one of the processes, which means that it is not always possible to choose a specific transistor type.

The deep electron traps are absent in the silicon-based transistors thus making them free from the g-r-noise, which is an advantage when designing oscillators.

The known solutions to the problem of making broadband VCOs, specially in MMIC technique are:

As the realisation of hyper abrupt varactor diodes on an MMIC is not possible through any of the known standard processes, usually they are located outside the chip. Normally, the entire resonator circuit 110 (FIG. 1) is arranged outside the chip 100 to obtain a better Q factor. The production is more expansive owing to the additional costs for the varactor diode. The performance,does not improve compared to a construction with the entire resonator on a single chip. Neither it is possible to use the encapsulated varactors at the frequencies above about 5 GHz due to theparasite reactances of the capsule, as the varactor diodes in chip form are difficult to bond to.

It is also possible to arrange the entire VCO on a Si or SiGe, if so-called 3D technique is used, in which dielectric layers are arranged on top of the chip, and a new ground plane and above it a new conducting layer are provided. Thus, it is possible to realise inductors with low losses. Nevertheless, the varactor diodes are still in the silicon and accordingly they are inferior to diodes in GaAs. Consequently, the entire solution tends to become inferior.

EP 523 564 describes an improved oscillating circuit for use in microwave frequency bands having reduced power loss and smaller in vertical size. The local oscillating circuit includes an MMIC oscillator comprising a FET and a resonator connected thereto so as to stabilize the oscillating frequency of the oscillator. The resonator is ring-shaped and arranged as close as several μm to several tens of μm to a predetermined position of a micro strip line forming a feedback loop connected to the FET forming the oscillator. Moreover, the resonator is a thin film formed by depositing a high-temperature superconducting material. As exemplar embodiments, YBCO, niobium and the like, can be used as high-temperature superconducting materials. Furthermore, a portion of the micro strip line, closest to the resonator, is concentrically disposed therewith to form a circular arc portion whose central angle is set at 90 degrees.

The object EP 893 878 is to provide a high-frequency oscillating circuit that does not have its characteristics such as a S/N ratio degraded by an external electromagnetic interference. The bases of a first and a second oscillating transistor are connected together directly or via a capacitor having a sufficiently low impedance at an oscillating frequency and wherein a differential signal output is obtained from between the emitters of the first and second oscillating transistors as an oscillating output. A resonator, varactor diodes, and capacitors and chokes constituting a resonating circuit for an oscillating circuit IC are integrated together as a module separate from a negative-resistance generating circuit including oscillating transistors configured as an IC.

EP 627 812 relates to a voltage controlled planar oscillator having a microwave transistor as the active component and a frequency-determining switching network connected thereto, which contains a varactor diode and a dielectric resonator. To be able to integrate such an oscillator monolithically on as small a chip as possible, it is proposed that the dielectric resonator is coupled to the switching network via a first microstrip line and that the microwave transistor is connected to one end of the first microstrip line with a first one of its three gates via the varactor diode.

According to DE 195 07 786 an oscillator has a superconductive resonator and at least one device-connected conductor, between first and second multilayer substrates and having a planar structure. A resonator is fixed on the second substrate; and the substrates are mutually aligned and joined and comprise, respectively, a first GaAs layer on which a conductor or the resonator is attached, an intermediate protective layer, pref. of Si3N4, and a second YBa2Cu3O7—delta layer.

For facilitating a compact and inexpensive preparation without lowering the Q of a resonator by forming a tuning circuit inside an MMIC and composing the resonator of an external resonance circuit connected to that, JP 829 37 28 discloses a MMIC voltage controlled oscillator (MMIC-VCO) includes the tuning circuit for frequency modulation into an MMIC and forms only a microstrip resonant line or a dielectric resonant element consisting of the resonator on the external circuit of the MMIC. This microstrip resonant line or dielectric resonant element and the MMIC are connected by wire bonding or ribbon bonding. Therefore, since the microstrip resonant line or dielectric resonant element to be the resonator is provided as the external resonant circuit, the Q of the resonant circuit is not lowered and when preparing the MMIC-VCO, it is not necessary to newly prepare another tuning circuit.

SUMMARY

The main objective of the present invention is to provide an arrangement which combines the advantages of two different techniques, e.g. GaAs and Si, and thereby provides a solution to above-mentioned problems and drawbacks.

The arrangement according to the present invention provides a broadband oscillator circuit which has very low or even no phase noise at all, low 1/f noise and a very high Q-factor compared to the known devices.

For these reasons, in the initially mentioned oscillator, the first substrate comprises at least two additional substrates: a second substantially insulating substrate and a third substantially semiconducting substrate, and in that at least said transistor is arranged on said third substrate while said first and second set of components are arranged on said second substantially insulating substrate.

In the most preferred embodiment, the transistor and said second set of components are arranged on said at least third substrate. The advantage of this embodiment is that small variations in, the bonding wire results in small variations in the phase displacement, which yields small variations in the phase but insignificant variations in the phase noise.

Preferably, the transistor and/or said second set of components on said third substrate are connected to said resonator on said second substrate by means of bonding wire.

Preferably, second substrate is one of Gallium Arsenide (GaAs), Indium Phosphide (InP), Gallium Nitride (GaN), Indium Arsenide (InAs), metamorphous techniques as a thin layers of InP on a wafer of GaAs or different types of filed effect transistor techniques and said third substrate (230) is one of Silicon (Si), Silicon Germanium (SiGe), Silicon Carbide (SiC) or the like.

Preferably, but not exclusively said amplifier is a reflection amplifier. The second set of components comprises a first and second feedback capacitors wherein said first capacitor connects the emitter of the transistor to its base and said second capacitor connects an output signal terminal to ground. In one embodiment, the resonator comprises an inductor in parallel with a resonator capacitor, comprising two anti-serially connected first and second varactor diodes, the varactor diodes being connected through their anodes to a scanning voltage through which the resonator capacitor is varied. The resonator further comprises a capacitor connected to the a third varactor diode for coupling the resonator to the amplifier.

Preferably, a first carrier or supporting member includes one of said second or third substrates.

The invention also concerns a method of arranging an oscillator comprising a first substrate on which a resonator circuit and an amplifier circuit. The resonator circuit comprises first set of components and said amplifier circuit comprising a second set of components and an amplifier transistor. The method comprises the steps of: arranging on said first substrate at least two additional substrates: a second substantially insulating substrate and a third substantially semiconducting substrate; arranging at least said transistor on said at least third substrate while said first and second set of components arrange on said second substantially insulating substrate. The method further comprises the step of arranging said transistor and said second set of components on said third substrate.

BRIEF DESCRIPTION OF THE DRAWINGS

In the following, the invention will be further described in non-limiting way under reference to the accompanying drawings in which.

DETAILED DESCRIPTION OF THE EMBODIMENTS

The main feature of the invention is to arrange the resonator circuit of an insulating substrate, such as GaAs and at least part of the amplifying circuit on a semiconductive substrate, such as Si or SiGe.

Figure 1:
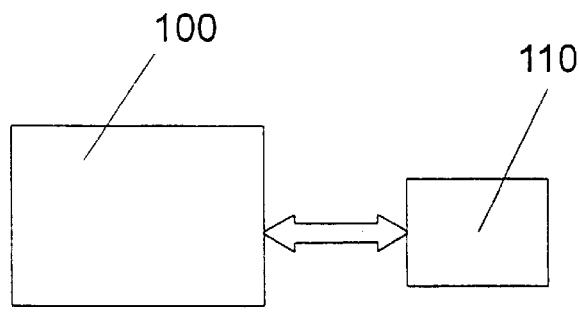
FIG. 1 is a block diagram over an arrangement according to known technique.
Figure 2:
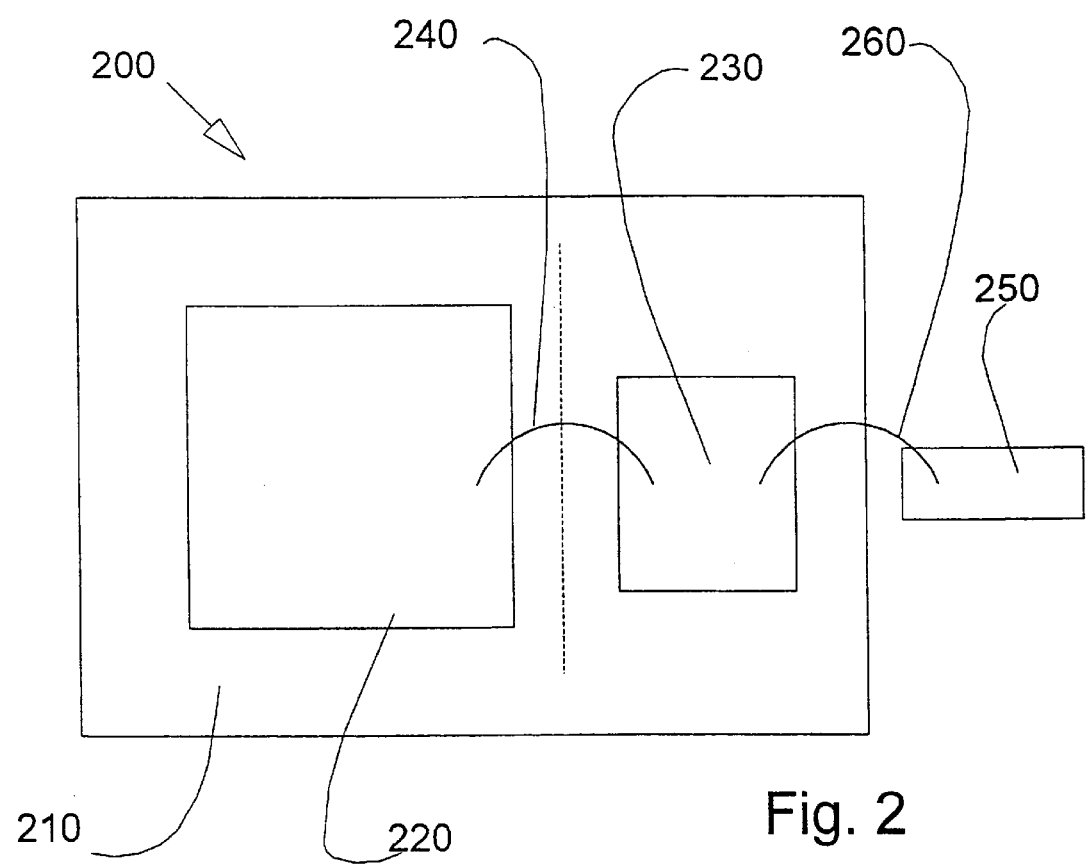
FIG. 2 is a block diagram showing the principle of the invention.

The block diagram of FIG. 2 shows the main parts of a voltage-controlled oscillator (VCO) 200 according to the invention. Accordingly, the VCO 200 comprises a supporting member, e.g. a chip cavity 210 on which a substantially insulating substrate 220 and a semiconducting substrate 230 are arranged in a conventional way. The entire resonator circuit is arranged on the substantially insulating substrate 220, while at least part of the amplifying circuit is arranged on the semiconducting substrate 230. The circuits on each substrate are interconnected by means of bonding wire(s) 240. The amplification circuit is connected to a RF means 250 through wiring 260.

Figure 3:
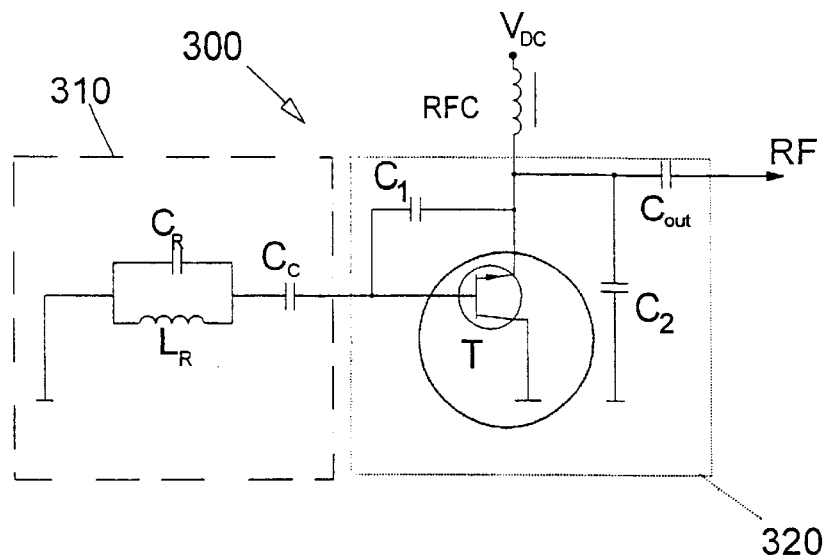
FIG. 3 illustrates a wiring diagram according to a first embodiment of the invention.

FIG. 3 shows the wiring diagram of an oscillator circuit 300. The oscillator 300 comprises two main parts, i.e. the resonator 310 (surrounded by dashed dot line) and the amplifier 320 (surrounded by dotted line). The resonator 310 comprises, very schematically illustrated, a LC circuit comprising inductor L/R and capacitor C/R. The amplifier, preferably a reflection amplifier 320, comprises a transistor T, feedback capacitors $C_1$ and $C_2$, capacitor $C_{out}$ and a (possible) inductance Radio Frequency Choke, RFC.

Figure 4:
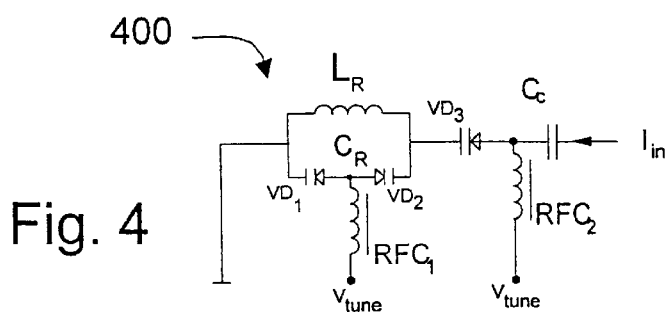
FIG. 4 is a wiring diagram over a resonator with variable frequency.

The resonator circuit 310 according to the present embodiment is illustrated very elementarily for simplifying the understanding of the invention. However, a preferred embodiment of the resonator is disclosed in more detail in FIG. 4. The resonator 400 according to FIG. 4 relates to a resonator according to above-mentioned Resonator Application. The function of the resonator is assumed to be known to a skilled person and not described closer in here. The resonator 400 comprises an inductor $L_R$, in parallel with a capacitor $C_R$. The capacitor $C_R$ comprises two anti-serially connected varactor diodes $V_{D1}$ and $V_{D2}$. The varactor diodes are connected through their anodes and a radio frequency choke, $RFC_1$ to a scanning voltage $V_{tune}$, through which the capacitor $C_R$ is varied. The varactor diodes $V_{D1}$ and $V_{D2}$ may also be connected together through their cathode terminals. Connecting the varactor diodes anti-serially allows varying of the capacitor $C_R$ without the diodes limiting the signal amplitude as the diode conducts current in its forward direction.

The resonator 400 further comprises capacitor $C_c$ connected to the varactor diode $V_{D3}$ for coupling the resonator to the amplifier. The capacitance of the varactor diode $V_{D3}$ is variable through the RF choke, $RFC_2$, by means of a scanning voltage $V_{tune}$, which can be the same scanning voltage as mentioned above.

Back to FIG. 3, in the amplifier 320 the feedback capacitor $C_1$ connects the emitter of the transistor T to its base and capacitor $C_2$ connects the output signal RF to ground. The feedback capacitors $C_1$ and $C_2$ are arranged to produce a positive feedback, which makes the circuit unstable and obtain better characteristics. The circuit is supplied with voltage $V_{DC}$ through a RF choke, RFC. However, the voltage may be supplied directly to the emitter of the transistor T. The screening capacitor $C_{out}$ shields the circuit from incoming noise.

According to the first aspect of the invention, the entire resonator circuit 310 and the amplifier circuit 320, except for the transistor T (encircled with dashed line), are arranged on the substantially insulating substrate, e.g. GaAs, Indium Phosphide (InP), Gallium Nitride (GaN), Indium Arsenide (InAs), metamorphous techniques as a thin layer on InP on a wafer of GaAs different types of field effect transistor techniques or the like. The transistor T is arranged on the semiconducting substrate, e.g. Si, SiGe, Silicon Carbide (Si or the like, and connected to the remaining circuitry through bonding wires. However, any choice and combination of semiconducting material, which provides an optimised semiconducting substrate for both the resonator and amplifier with optimal Q- factor and lowest possible transistor noise may occure.

Figure 5:
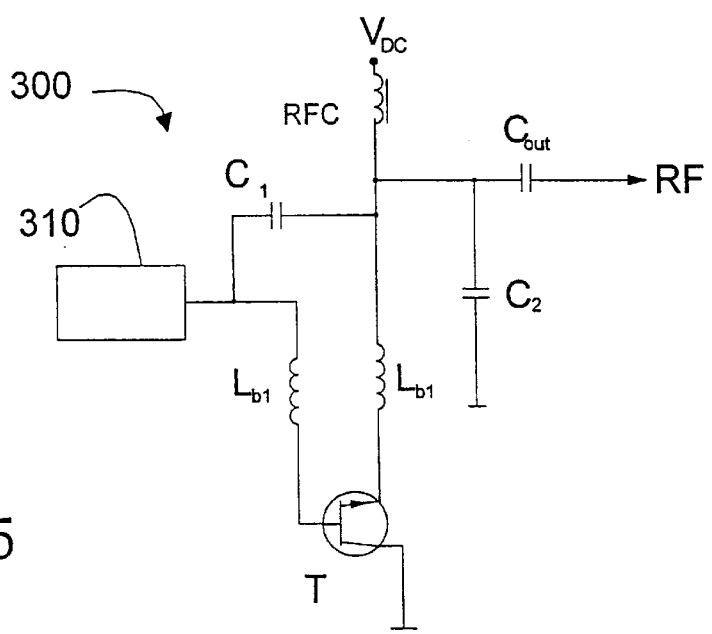
FIG. 5 illustrates an equivalent wiring diagram according to the embodiment of FIG. 3.

FIG. 5 is the equivalent wiring diagram for the first aspect of the invention, i.e. placing the transistor T on the semiconducting substrate. Two new inductances $L_{b1}$ and $L_{b2}$ are introduced due the presence of the bonding wires connecting the base and the emitter of the transistor T to the remaining circuitry. This is however a drawback as the inductances $L_{b1}$ and $L_{b2}$ (about 0.5 nH ±0.1 nH for bonding wires having a thickness of 400–500 km) deteriorate the characteristics of the amplifier and thus the features of the oscillator. Moreover, the manufacturing process for this embodiment is more demanding as bonding process generally results in different lengths for bonding wire and accordingly different values for $L_{b1}$ and $L_{b2}$.

Figure 6:
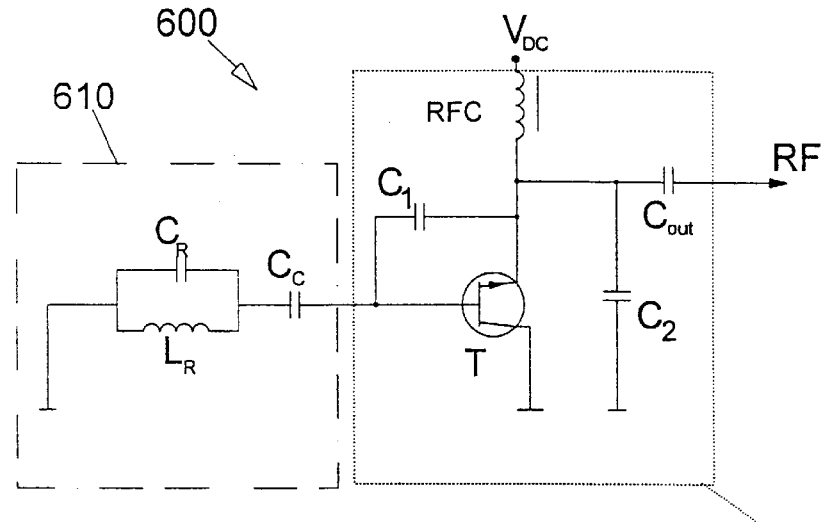
FIG. 6 illustrates a wiring diagram according to a second embodiment of the invention.

The most preferred embodiment of the invention is illustrated in FIG. 6. The oscillator circuit is exactly the same as the embodiment of FIG. 3, however, here the partition is between the amplifier circuit 620 and the resonator circuit, which is more distinct as the entire amplifier circuit 620, i.e.

including the transistor T, feedback capacitors $C_1$ and $C_2$, output capacitor $C_{out}$ and RFC, is arranged on the semiconducting substrate. The base of the transistor T is connected to the coupling capacitor $C_c$ of the resonator circuit 610.

Figure 7:
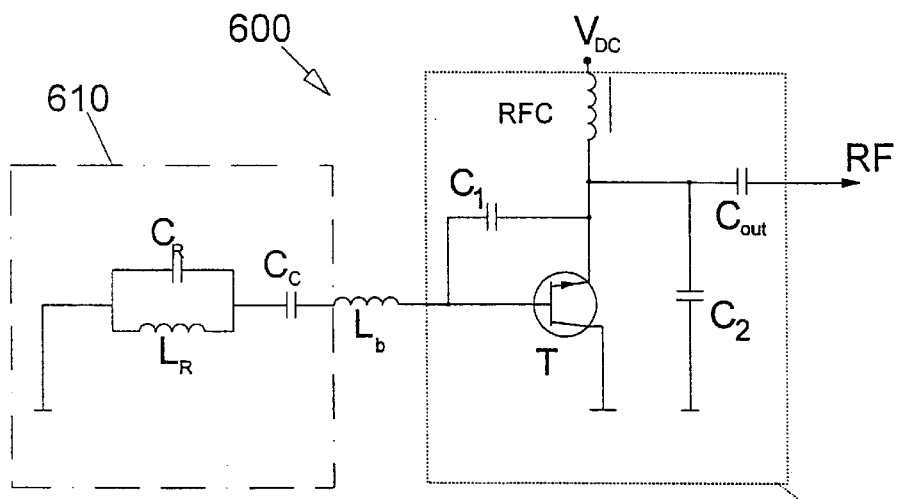
FIG. 7 illustrates an equivalent wiring diagram according to the embodiment of FIG. 6.

FIG. 7 is the equivalent wiring diagram for the second aspect of the invention, i.e. placing the entire amplifier section on the semiconducting substrate. A new inductance $L_{b3}$ is introduced due to the presence of the bonding wire connecting the base of the transistor T to the resonator circuit.

The advantage of this embodiment is that small variations in the bonding wire results in small variations in the phase displacement, which yields small variations in the phase but insignificant variations in the phase noise.

Figure 8:
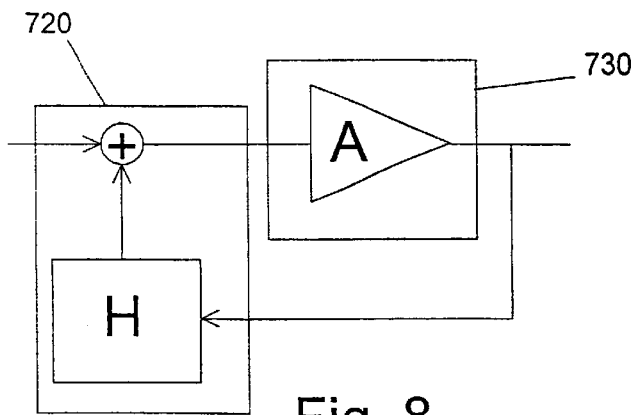
FIG. 8 is a block diagram illustrating a positive feed-back amplifier.

In yet another embodiment the oscillator may be regarded as a positive feedback amplifier 800, shown in FIG. 8, in which the feed-back network H and the amplifier circuit A are distinctly separated. This circuitry is suitable for lower frequencies (e.g. <3 GHz), as it is easier to distinguish the parts belonging to the amplifier part and parts belonging to the feed-back part. It should be noted that it is possible to transform between this model and the resonator-amplifier model. Accordingly, the resonator consists of the feedback network H. Also, here it is required that the resonator has a high Q-factor and that the amplifier has a low 1/f noise. Consequently, it is possible to apply the invention to this type of circuits, i.e. the feedback network on the substantially insulating substrate 820 and the amplifier on the semiconducting substrate 830.

The invention is not limited the shown embodiments but can be varied in a number of ways without departing from the scope of the appended claims and the arrangement and the method can be implemented in various ways depending on application, functional units, needs and requirements etc. In one embodiment, for example, the semiconducting substrate can directly be arranged on the insulating substrate or in a cavity arranged on the insulating substrate. The amplification and resonator circuits may be provided with more or fewer components with respect to the relevant applications.

What is claimed is:

1. An oscillator comprising a first substrate on which a resonator circuit and an amplifier circuit are arranged, said resonating circuit comprising a first set of components and said amplifier circuit comprising a second set of components and an amplifier transistor, wherein said first substrate comprises at least two additional substrates: a second substantially insulating substrate and a third substantially semiconducting substrate, and at least said amplifier transistor is arranged on said third substrate while said first and second set of components are arranged on said second substantially insulating substrate, wherein said amplifier transistor is a reflection amplifier, said second set of components comprises a first and second feedback capacitor, and wherein said first feedback capacitor connects the emitter of the amplifier transistor to its base and said second feedback capacitor connects an output signal terminal to ground.

2. An oscillator comprising a first substrate on which a resonator circuit and an amplifier circuit are arranged, said resonator circuit comprising a first set of components and said amplifier circuit comprising a second set of components and an amplifier transistor, wherein said first substrate comprises at least two additional substrates: a second substantially insulating substrate and a third substantially semiconducting substrate, and at least said amplifier transistor is arranged on said third substrate while said first and second set of components are arranged on said second substantially insulating substrate, wherein said resonator circuit comprises an inductor in parallel with a resonator capacitor, comprising two anti-serially connected first and second varactor diodes, the varactor diodes being connected through their anodes to a scanning voltage through which the resonator capacitor is varied.

3. The oscillator according to claim 2, wherein said resonator circuit further comprises a capacitor connected to a third varactor diode for coupling the resonator circuit to the amplifier transistor.

* * * * *